US010819282B2

(12) United States Patent
Broekaart et al.

(10) Patent No.: US 10,819,282 B2
(45) Date of Patent: Oct. 27, 2020

(54) METHOD FOR MINIMIZING DISTORTION OF A SIGNAL IN A RADIOFREQUENCY CIRCUIT

(71) Applicant: Soitec, Bernin (FR)

(72) Inventors: Marcel Broekaart, Theys (FR); Frederic Allibert, Grenoble (FR); Eric Desbonnets, Lumbin (FR); Jean-Pierre Raskin, Louvain-la-Neuve (BE); Martin Rack, Louvain-la-Neuve (BE)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/614,732

(22) PCT Filed: May 23, 2018

(86) PCT No.: PCT/EP2018/063427
§ 371 (c)(1),
(2) Date: Nov. 18, 2019

(87) PCT Pub. No.: WO2018/215498
PCT Pub. Date: Nov. 29, 2018

(65) Prior Publication Data
US 2020/0169222 A1 May 28, 2020

(30) Foreign Application Priority Data
May 23, 2017 (FR) ..................... 17 54567

(51) Int. Cl.
*H01L 23/66* (2006.01)
*H03C 7/00* (2006.01)
(52) U.S. Cl.
CPC ............... *H03C 7/00* (2013.01); *H01L 23/66* (2013.01); *H01L 2223/6661* (2013.01); *H03C 2200/0079* (2013.01)

(58) Field of Classification Search
CPC ... H03C 7/00; H03C 2200/0079; H01L 23/66; H01L 2223/6661
(Continued)

(56) References Cited
U.S. PATENT DOCUMENTS
2015/0115480 A1* 4/2015 Peidous ............ H01L 21/76251
257/798
2016/0071958 A1* 3/2016 Liu ..................... H01L 21/304
257/76
(Continued)

FOREIGN PATENT DOCUMENTS
EP 2503592 A1 9/2012
EP 3144958 A1 3/2017

OTHER PUBLICATIONS

Deng et al., Design of an Embedded CMOS Temperature Sensor for Passive RFID Tag Chips, Sensors, vol. 15, (2015), pp. 11442-11453.
(Continued)

Primary Examiner — Ryan Jager
(74) Attorney, Agent, or Firm — TraskBritt

(57) ABSTRACT

A method for minimizing harmonic distortion and/or intermodulation distortion of a radiofrequency signal propagating in a radiofrequency circuit formed on a semiconductor substrate coated with an electrically insulating layer, wherein a curve representing the distortion as a function of a power of the input or output signal exhibits a trough around a given power ($P_{Dip}$), the method comprises applying, between the radiofrequency circuit and the semiconductor substrate, an electrical potential difference ($V_{GB}$) chosen so as to move the trough toward a given operating power of the radiofrequency circuit.

20 Claims, 6 Drawing Sheets

(58) Field of Classification Search
USPC .......................................................... 327/518
See application file for complete search history.

(56) References Cited

U.S. PATENT DOCUMENTS

| | | | | |
|---|---|---|---|---|
| 2017/0243781 A1* | 8/2017 | Peidous | ............ | H01L 29/40117 |
| 2017/0338143 A1* | 11/2017 | Peidous | ............ | H01L 21/02005 |
| 2017/0372946 A1* | 12/2017 | Peidous | .................. | E21B 33/10 |
| 2018/0047614 A1* | 2/2018 | Usenko | .............. | G03G 21/1647 |
| 2018/0114720 A1* | 4/2018 | Wang | .................. | H01L 27/1203 |
| 2018/0158721 A1* | 6/2018 | Libbert | ............. | H01L 21/76254 |
| 2018/0183406 A1* | 6/2018 | Patil | ..................... | H03H 9/1014 |
| 2019/0027397 A1* | 1/2019 | Peidous | .............. | H01L 21/0245 |
| 2019/0080957 A1* | 3/2019 | Peidous | .................. | H01L 21/84 |
| 2019/0259654 A1* | 8/2019 | Liu | .................... | H01L 21/02112 |
| 2020/0020766 A1* | 1/2020 | Seacrist | ............ | H01L 21/02447 |

OTHER PUBLICATIONS

International Search Report for International Application No. PCT/EP2018/063427 dated Sep. 3, 2019, 3 pages.
International Written Opinion for International Application No. PCT/EP2018/063427 dated Sep. 3, 2019, 5 pages.

\* cited by examiner (a) (b) (c) (d)

METHOD FOR MINIMIZING DISTORTION OF A SIGNAL IN A RADIOFREQUENCY CIRCUIT

CROSS-REFERENCE TO RELATED APPLICATIONS

This application is a national phase entry under 35 U.S.C. § 371 of International Patent Application PCT/EP2018/063427, filed May 23, 2018, designating the United States of America and published as International Patent Publication WO 2018/215498 A1 on Nov. 29, 2018, which claims the benefit under Article 8 of the Patent Cooperation Treaty to French Patent Application Serial No. 1754567, filed May 23, 2017.

TECHNICAL FIELD

The present disclosure relates to a method for minimizing harmonic distortion and/or intermodulation distortion of a signal in a radiofrequency circuit.

BACKGROUND

Radiofrequency (RF) circuits formed on semiconductor substrates suffer from the non-linearity of the material forming the substrates.

This non-linearity brings about interactions between the material of the substrate and the signal transmitted within the radiofrequency circuit, which interactions are reflected in harmonic distortion and/or intermodulation distortion (IMD).

For optimum performance of the radiofrequency circuit, it is therefore sought to maximize the linearity of the substrate.

In this respect, successive standards in the field of telecommunications are increasingly stringent.

In radiofrequency applications, it is known to use substrates of silicon on insulator (SOI) type comprising, from its surface to its base, an electrically conductive thin layer, for example, made of silicon, an electrically insulating layer and a silicon carrier substrate with high electrical resistivity.

In the present text, 'high resistivity' is understood to mean an electrical resistivity of greater than 500 Ω·cm, preferably greater than 1000 Ω·cm, or even more.

FIG. 1A thus illustrates a perspective view of a radiofrequency circuit formed on an SOI whose carrier substrate is a silicon substrate 1 with high electrical resistivity. The substrate is coated with an electrically insulating layer 2, for example, made of silicon oxide ($SiO_2$). Metal lines L intended to conduct the signal are formed on the electrically insulating layer 2. The semiconductor thin layer of the SOI, which layer is situated on the electrically insulating layer 2, has been removed at least locally in order to deposit the lines L, and is therefore not visible in FIG. 1A or in FIGS. 1B and 1C described hereinafter.

However, the linearity of such substrates remains insufficient for certain applications.

Moreover, SOI substrates with a charge trap layer situated under the electrically insulating layer have been developed. These substrates are usually referred to using the term 'trap rich' in the field of radiofrequency applications.

FIG. 1B thus illustrates a perspective view of a radiofrequency circuit successively comprising a silicon substrate 1 with high electrical resistivity, a polycrystalline silicon layer 3, an electrically insulating layer 2, for example, made of silicon oxide, and metal lines L intended to conduct the signal. The polycrystalline silicon layer 3 performs the charge-trapping function by virtue of the presence of grain boundaries at which electric charges present under the electrically insulating layer are able to be trapped.

FIG. 1C illustrates a perspective view of a radiofrequency circuit with what is termed a 'double BOX' (or 'double buried oxide') structure, that is to say successively comprising a silicon substrate 1 with high electrical resistivity, a first electrically insulating layer 2a (for example, made of silicon oxide), a polycrystalline silicon layer 3, a second electrically insulating layer 2b (for example, made of silicon oxide), and metal lines L intended to conduct the signal.

Although substrates of 'trap rich' type give good results in radiofrequency applications, increasing the requirements in terms of circuit performance makes it necessary to develop additional means for minimizing the generation of parasitic harmonics.

BRIEF SUMMARY

One aim of the present disclosure is therefore to design a method for controlling a radiofrequency circuit that makes it possible to reduce harmonic distortion and/or intermodulation distortion caused by the non-linearity of the substrate on which the circuit is formed.

To this end, the present disclosure proposes a method for minimizing harmonic distortion and/or intermodulation distortion of a radiofrequency signal propagating in a radiofrequency circuit formed on a semiconductor substrate coated with an electrically insulating layer, wherein a curve representing the distortion as a function of a power of the input or output signal exhibits a trough around a given power, the method being characterized in that it comprises applying, between the radiofrequency circuit and the semiconductor substrate, an electrical potential difference chosen so as to move the trough toward a given operating power of the radiofrequency circuit.

Particularly advantageously, the electrical potential difference is chosen so as to comply with the following equation: $V_{pk}=|V_{GB}-V_{FB}|$, where $V_{pk}$ is the peak voltage of the radiofrequency signal and $V_{FB}$ is the flat band voltage of the metal (semiconductor lines of the radiofrequency circuit)-insulator-semiconductor structure.

According to one embodiment, the semiconductor substrate has an electrical resistivity of greater than 500 Ω·cm.

According to one form of implementation, a polycrystalline silicon layer is arranged between the semiconductor substrate and the electrically insulating layer.

Optionally, an additional electrically insulating layer may be arranged between the semiconductor substrate and the polycrystalline silicon layer.

According to one embodiment, the semiconductor substrate is made of silicon.

According to one form of implementation of embodiments of the present disclosure, the method comprises adjusting the electrical potential difference applied between the semiconductor substrate and the radiofrequency circuit depending on the operating power of the radiofrequency circuit.

Advantageously, the method may furthermore comprise measuring the temperature of the radiofrequency circuit, and adjusting the electrical potential difference applied between the semiconductor substrate and the radiofrequency circuit depending on the measured temperature.

The curve representing the distortion of the signal is typically a curve of the level of generation of the second or of the third harmonic of the input signal or of the output signal as a function of the power of the input signal or of the fundamental component of the output signal.

Another subject of the present disclosure relates to a radiofrequency device in which such harmonic and/or intermodulation distortion is able to be minimized.

Said device comprises:

a radiofrequency circuit formed on a semiconductor substrate coated with an electrically insulating layer, a contact connected electrically to the semiconductor substrate, a means for applying a potential difference between the contact and the radiofrequency circuit, the device being characterized in that the application means is configured to apply the potential difference chosen so as to move a trough around a given power in a curve representing harmonic distortion and/or intermodulation distortion of a radiofrequency signal propagating in the circuit as a function of a power of the input or output signal toward a given operating power of the radiofrequency circuit.

According to one embodiment, the means for applying the potential difference comprises a voltage generator and a voltage control module configured to adjust the voltage of the generator depending on the operating power of the radiofrequency circuit.

According to one embodiment, the semiconductor substrate has an electrical resistivity of greater than 500 Ω·cm.

According to one form of implementation, a polycrystalline silicon layer is arranged between the semiconductor substrate and the electrically insulating layer.

Optionally, an additional electrically insulating layer is arranged between the semiconductor substrate and the polycrystalline silicon layer.

According to one embodiment, the semiconductor substrate is made of silicon.

The device may furthermore comprise a temperature sensor coupled to the means for applying the potential difference, the means being configured to adjust the potential difference depending on the temperature measured by the sensor.

BRIEF DESCRIPTION OF THE DRAWINGS

Other advantages and features of embodiments of the present disclosure will emerge from the following detailed description, with reference to the appended drawings, in which.

To make the figures legible, the various layers forming the substrates are not necessarily shown to scale.

DETAILED DESCRIPTION

The present disclosure is based on the observation, with certain semiconductor substrates coated with an electrically insulating layer, of a local drop of the level of generation of a harmonic or of the level of intermodulation for a certain power of the input signal.

The term 'level of generation of a harmonic' is understood, in the present text, to mean the power of a given harmonic measured at the output of the radiofrequency circuit, expressed in dBm. This power may be expressed for a power of the fundamental component of the input signal (the notation 'in' will then be used) or of the output signal (the notation 'out' will then be used).

In the remainder of the description, consideration will often be given to the level of generation of the second harmonic (denoted HD2), but the present disclosure may also be implemented with consideration to the level of a higher generated harmonic, for example, the third harmonic (denoted HD3), or even a level of intermodulation. In a general manner, these levels represent the non-linearity of the substrate.

In the remainder of the description, the example will generally be taken of a silicon substrate with high resistivity coated with a layer of silicon oxide, but the present disclosure applies more generally to a semiconductor substrate coated with an electrically insulating layer. In general, these semiconductor substrates belong to SOI substrates whose semiconductor thin layer is at least locally removed in order to deposit the electrically conductive lines on the electrically insulating layer (the semiconductor thin layer being able to be kept in other regions of the substrate so as to form electronic components). As an alternative, the electrically insulating layer could be formed by oxidation of a semiconductor substrate, with high resistivity or with standard resistivity, without an SOI substrate being formed.

Figure 2:
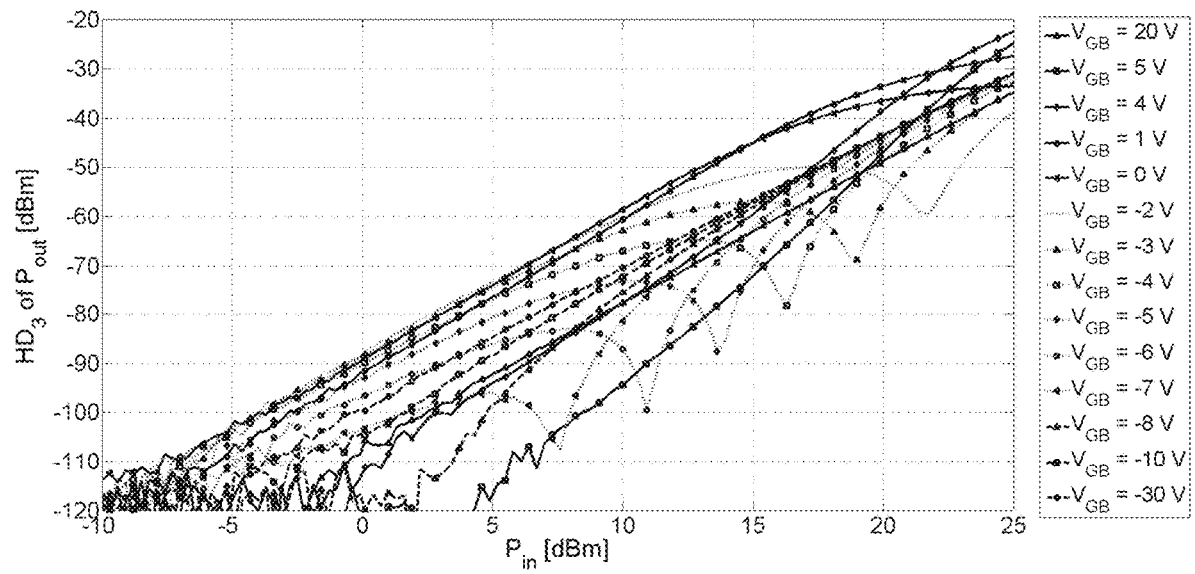
FIG. 2 shows curves of the level of generation of the third harmonic (in dBm) as a function of the level of the first harmonic of the output signal (in dBm), for a silicon substrate with standard resistivity, for various potential differences applied between the substrate and the radiofrequency circuit.

A drop in the level of generation of the third harmonic is visible in FIG. 2, which relates to a radiofrequency circuit formed on an SOI comprising a silicon substrate having a standard electrical resistivity (lower than the abovementioned high resistivity, for example, of the order of 10

Ω·cm), for various potential differences $V_{GB}$ applied between the silicon substrate and the radiofrequency circuit.

Figure 3:
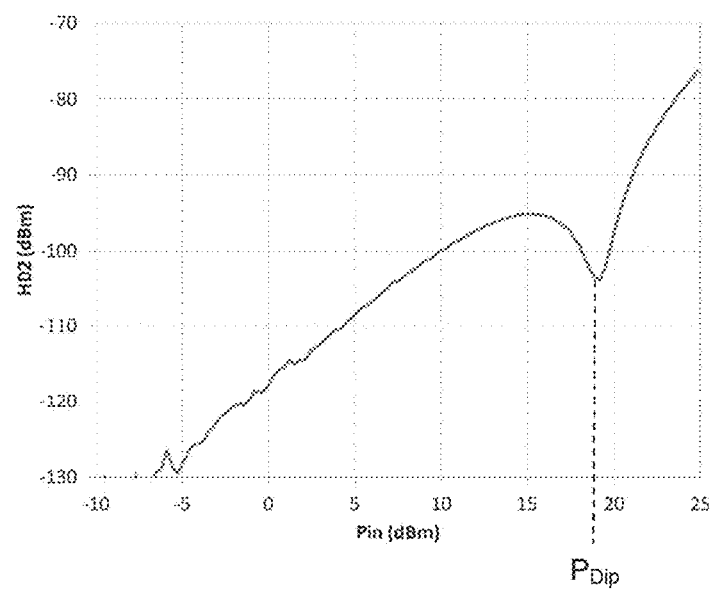
FIG. 3 shows curves of the level of generation of the second harmonic (in dBm) as a function of the level of the first harmonic of the input signal (in dBm), for a 'trap rich' SOI substrate with a silicon carrier substrate with high resistivity.

A drop in the level of generation of the second harmonic is also visible in FIG. 3, which relates to a radiofrequency circuit formed on an SOI comprising a silicon substrate having a high electrical resistivity, for a given potential difference $V_{GB}$ applied between the silicon substrate with high electrical resistivity of the 'trap rich' SOI substrate and the radiofrequency circuit.

FIGS. 2 and 3 show the level of generation of the third and of the second harmonic of the output signal, respectively, expressed in dBm, as a function of the level of the first harmonic, that is to say the fundamental component, of the input signal, also expressed in dBm.

It is recalled that the powers Pin and Pout in dBm are simply offset by an interval corresponding to the losses of the conductive line in dBm. For example, if the losses are 3 dBm over the whole line at the frequency of the fundamental component, and a trough is observed in the curve Pin vs. HD2 at +20 dBm from Pin, this trough will be located at +17 dBm from Pout_H1 in the curve Pout_H1 vs. HD2.

It is seen that these curves have a trough with a significant amplitude in a given range of the power Pin, this range being of small width and generally situated in the high power values, around a value denoted $P_{Dip}$ in FIG. 3.

The presence of this trough implies that, surprisingly, in this power range, the level of generation of the third, respectively of the second, harmonic is substantially lower than if the curve had remained substantially straight.

The inventors account for the position of this trough through the input power corresponding to the situation where the peak amplitude of the radiofrequency signal, denoted $V_{pk}$, reaches or exceeds the flat band voltage, denoted $V_{FB}$. This trough therefore appears for a level of power in watts $P_{Dip}$, associated with a signal amplitude $V_{pk_{Dip}}$, and expressed by the following equations:

$$P_{Dip} = \frac{V_{pk_{DIP}}^2}{2 \cdot Z_{REF}}$$

$$V_{pk_{dip}} = |V_{GB} - V_{FB}|$$

Therefore:

$$P_{Dip} = \frac{(V_{GB} - V_{FB})^2}{2 \cdot Z_{REF}}$$

where $Z_{REF}$ is the reference impedance of the system (generally 50 ohms), $V_{GB}$ is the electrical potential difference applied between the radiofrequency circuit and the semiconductor substrate, and $V_{FB}$ is the flat band voltage of the semiconductor-insulator-metal structure. This voltage characterizes a state of the semiconductor substrate under the electrically insulating layer that is neither in desertion regime nor in accumulation regime. In this state, the Fermi levels of the metal, of the insulator and of the semiconductor material are aligned.

The trough is thus able to be positioned at the desired level of power by applying an appropriate potential difference $V_{GB}$, so as to comply with the above equations.

Figure 4:
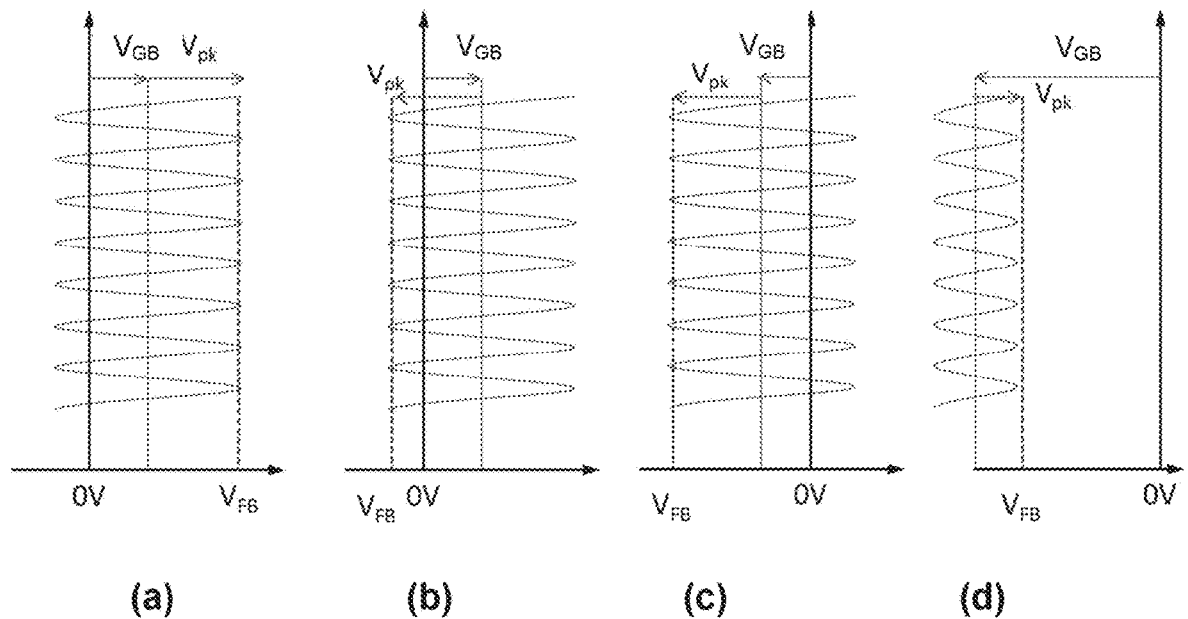
FIG. 4 shows various configurations of the voltage to be applied between the semiconductor substrate and the radiofrequency circuit in order to attain the flat band voltage of the metal-insulator-semiconductor structure as a function of the peak voltage of the signal.

As illustrated in FIGS. 4 (a) to (d), various situations exist, depending on the positions of the voltages $V_{pk}$ and $V_{FB}$.

In any case, it is possible to define a potential difference $V_{GB}$ that makes it possible to comply with this equation $V_{pk_{Dip}} = |V_{GB} - V_{FB}|$ or at the very least to get close to it.

It will be noted that there may be an attenuation along the conductive line, expressed in dB/mm. The loss in terms of $V_{pk}$ on a substrate with high resistivity along a line of a few millimeters may thus be of a factor of 2.

In such a case, it is possible, instead of considering a single value Vpk as above, to distinguish the terminals $V_{pk\_in}$ and $V_{pk\_out}$:

$$V_{pk\_in} = \sqrt{2Z_{REF}P_{in}}$$

$$V_{pk\_out} = \sqrt{2Z_{REF}P_{out}}$$

In particular, when consideration is given to a curve of HD2 of Pout as a function of H1 of Pout, and the trough $P_{Dip}$ is located at a certain output power point (H1 of Pout), the value of Vpk to be considered is Vpk_out.

It will be noted in the case of FIG. 3 that the radiofrequency circuit is formed on an SOI substrate of 'trap rich' type that is of poor quality, that is to say for which the polycrystalline silicon layer has partially recrystallized. The trough phenomenon is attributed to the fact that the behavior of the substrate is then similar to that of a silicon substrate with high resistivity.

The inventors have therefore exploited the abovementioned phenomenon so as to minimize harmonic distortion and/or intermodulation distortion, as they are able to design and/or adjust the position of the trough to the desired operating power, so as to minimize the distortion or intermodulation terms that are generated.

Figure 5:
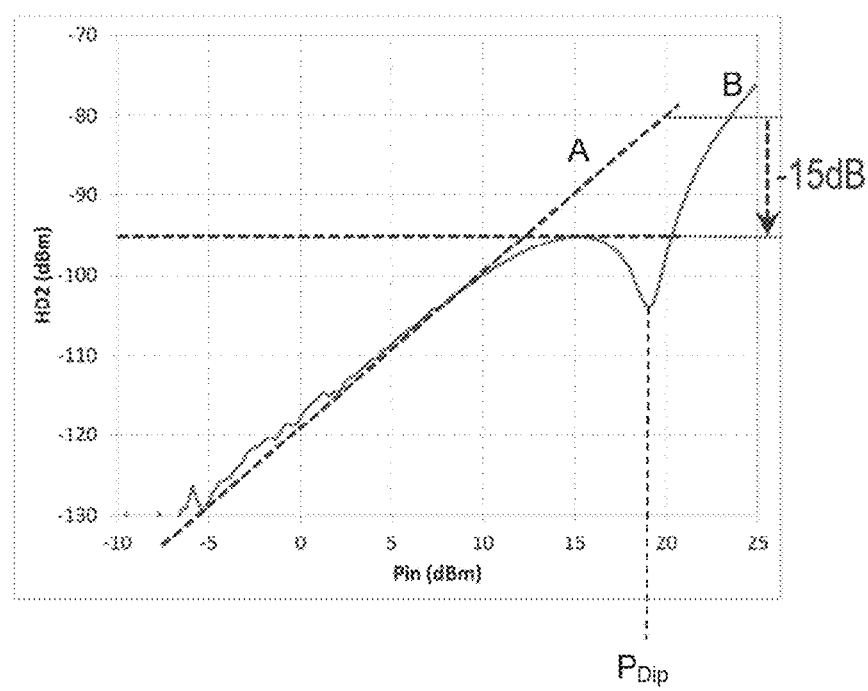
FIG. 5 shows the principle of the performance optimization afforded by adjusting the position of the trough of the level of generation of the second harmonic as a function of the level of the first harmonic.

Thus, as is seen in FIG. 5, if the straight line A, which corresponds to a first substrate, not having the abovementioned trough, is compared with the curve B of a second substrate having the trough, it is observed that, for a given power of the input signal, the level of generation of the second harmonic reaches a ceiling that is below the value reached with the first curve.

In the example illustrated, for a power $P_{in}$ of the input signal corresponding to 20 dBm, the level of generation of the second harmonic is −80 dBm for the first substrate, and −95 dBm at most for the second substrate. Thus, there is a gain of around 15 dBm with the second substrate if the level of the first harmonic of the input signal is within the range corresponding to the trough.

Adjusting the potential difference $V_{GB}$ makes it possible to move the trough of the distortion curve into a range that corresponds to the power of the input signal.

Figure 6:
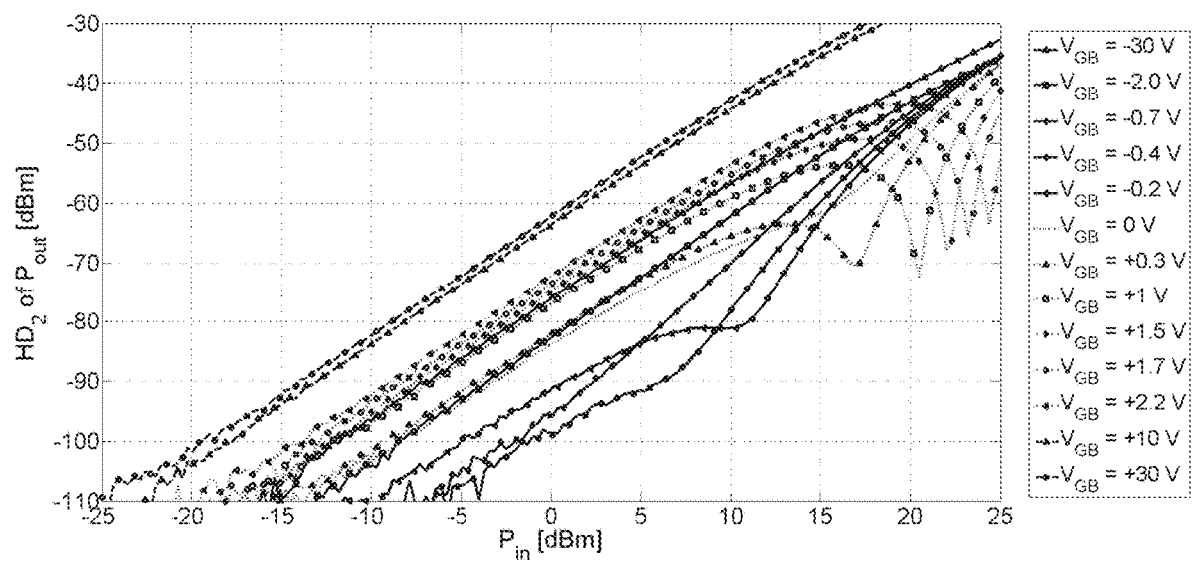
FIG. 6 shows curves of the level of generation of the second harmonic (in dBm) as a function of the level of the first harmonic of the output signal (in dBm), for an SOI substrate with a silicon carrier substrate with high resistivity, for various potential differences applied between the semiconductor substrate and the radiofrequency circuit.

FIG. 6 shows curves of the level of generation of the second harmonic (in dBm) as a function of the level of the first harmonic of the output signal (in dBm), for various applied potential differences $V_{GB}$.

As is able to be seen in this figure, varying $V_{GB}$ makes it possible to significantly move the trough.

According to one embodiment, the potential difference $V_{GB}$ is fixed.

According to another embodiment, the potential difference $V_{GB}$ is adjusted dynamically, during operation of the radiofrequency circuit, so as to ensure that the trough of the distortion curve always corresponds to a given operating power of the radiofrequency circuit; the power may be, in particular, the maximum power of the input signal, or another power value chosen by a person skilled in the art.

To this end, the radiofrequency device comprises a loop for servo-controlling the potential difference $V_{GB}$ to the power Pin of the input signal.

It will be noted that the design of the semiconductor substrate and of the electrically insulating layer may make it possible to adjust the flat band voltage $V_{FB}$. Thus, for example, the voltage $V_{FB}$ may be modified by modifying the quantity of electric charges in the electrically insulating layer. The voltage $V_{FB}$ may also be modified by doping the semiconductor substrate, but this solution is less preferable, in particular, in the case of a substrate with high resistivity given the fact that the dopants may lead to a reduction in the electrical resistivity of the semiconductor substrate and therefore to an amplification of its non-linear nature.

Moreover, measurements have demonstrated the effect of the temperature of the radiofrequency circuit on the appearance of the trough in the distortion curve.

Figure 7A:
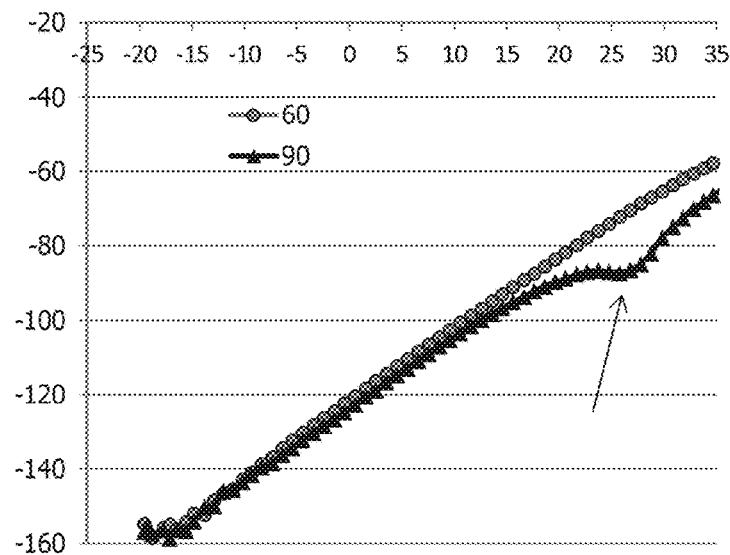
FIGS. 7A and 7B show curves of the level of generation of the second harmonic as a function of the level of the first harmonic for a 'trap rich' SOI substrate having, under the electrically insulating layer, a polycrystalline silicon layer, with a thickness of 0.4 μm and with a thickness of 1.7 μm, respectively, at temperatures of 60° and 90° C.
Figure 7B:
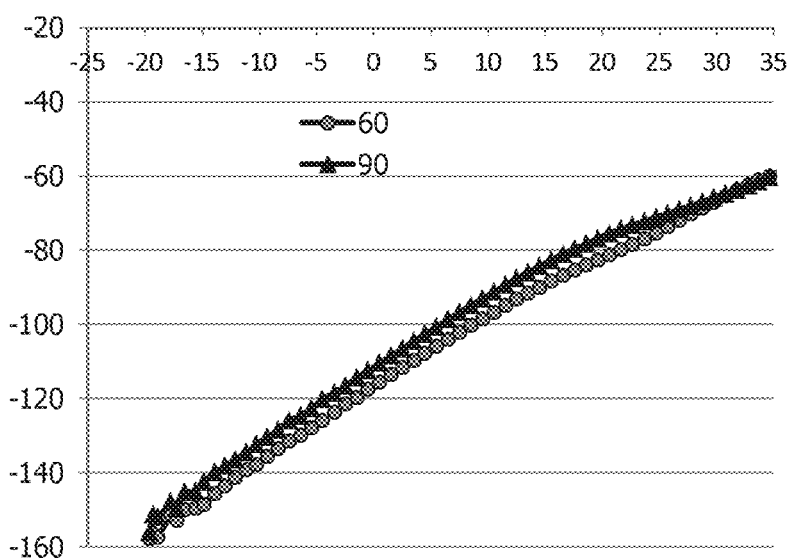

FIGS. 7A and 7B thus show curves of the level of generation of the second harmonic as a function of the level of the first harmonic for a 'trap rich' SOI substrate having, under the electrically insulating layer, a polycrystalline silicon layer with a thickness of 0.4 μm (FIG. 7A) and with a thickness of 1.7 μm (FIG. 7B), at temperatures of 60° and 90° C.

The curves are substantially linear for a temperature of 60° C.

For a temperature of 90° C., a trough is observed in the curve of FIG. 7A, whereas that of FIG. 7B remains substantially linear.

FIG. 7A therefore demonstrates an effect of the temperature on the appearance of a trough in the level of generation of the second harmonic. This effect appears to be explained by the fact that the temperature generates charge carriers that will fill the traps corresponding to the grain boundaries of the polycrystalline silicon whose thickness is small. The result of this is that, for a high-power Pin, the 'trap rich' SOI substrate behaves like a substrate with high resistivity, and therefore becomes sensitive to the flat band phenomenon.

The potential difference $V_{GB}$ may therefore advantageously be defined at the operating temperature envisaged for the radiofrequency circuit.

It is also possible to exploit this observation to control the movement of the trough depending on the temperature.

Thus, by virtue of a temperature sensor that makes it possible to sense the temperature of the radiofrequency circuit or of its immediate surroundings, it is possible to take into account the measured temperature so as to control the potential difference $V_{GB}$, in order to ensure that the trough is always within the operating power range of the radiofrequency circuit (for example, the maximum power of the signal).

Such a temperature sensor may, for example, be of the type described in the article by Deng F, He Y, Li B, et al. Design of an Embedded CMOS Temperature Sensor for Passive RFID Tag Chips. Passaro VMN, ed. Sensors (Basle, Switzerland). 2015; 15(5):11442-11453. doi:10.3390/s150511442.

In practice, the present disclosure may be implemented as follows.

In a manner known per se, the radiofrequency circuit is designed, this generally involving designing the semiconductor substrate and the electrically insulating layer on which it is formed.

From this design, it is possible to derive the flat band voltage of the metal-insulator-semiconductor structure.

Where appropriate, it is possible to choose to modify the flat band voltage, this for example, involving modifying the quantity of charges in the electrically insulating layer.

Moreover, with knowledge of the targeted power Pin and the associated peak voltage $V_{pk}$, it is possible to derive, from the equation $V_{pk}=|V_{GB}-V_{FB}|$, the value of the potential difference $V_{GB}$ to be applied between the radiofrequency circuit and the semiconductor substrate.

This potential difference may be applied in various ways. In general, it requires a voltage generator, advantageously coupled to a module for controlling the voltage, which module is configured to adjust the voltage of the generator depending on the operating power of the radiofrequency circuit. The voltage generator is separate from the device for powering the radiofrequency circuit. Moreover, a contact has to be connected electrically to the semiconductor substrate, in order to apply a reference potential to the substrate.

Figure 1A:
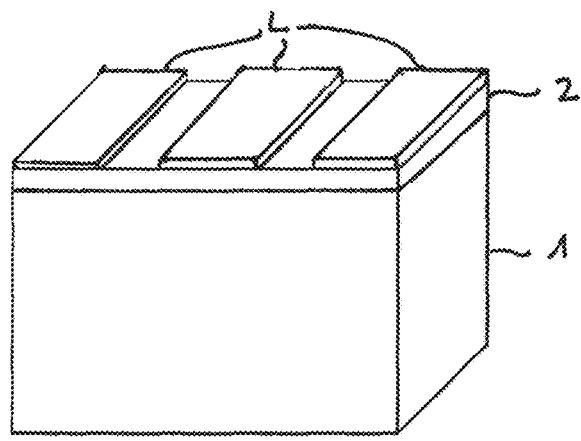
FIG. 1A is a perspective view of a radiofrequency circuit formed on an SOI substrate with high electrical resistivity.
Figure 8A:
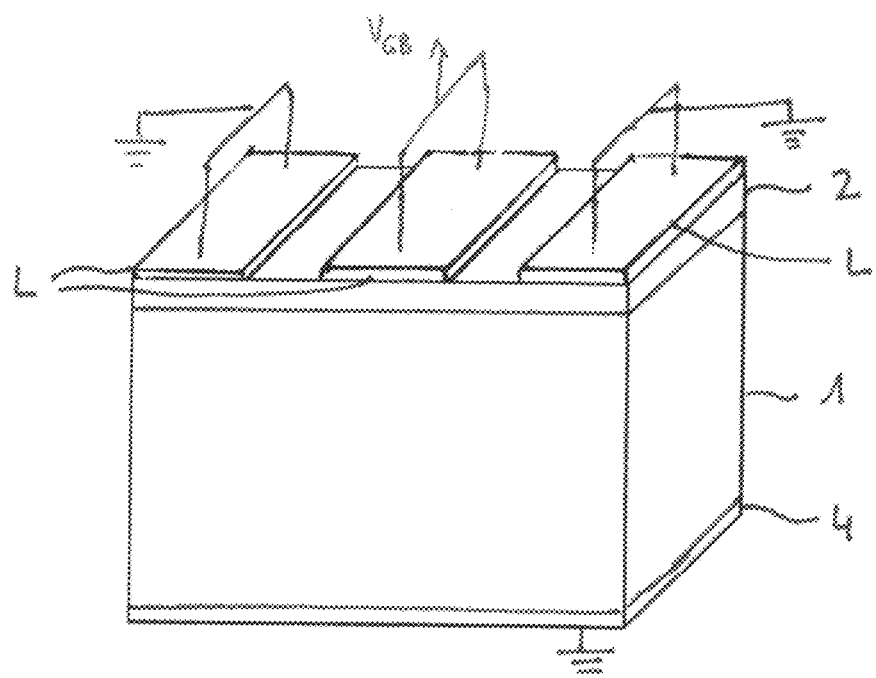
FIGS. 8A to 8C illustrate embodiments of the present disclosure applied to an SOI substrate with a silicon carrier substrate with high resistivity, a 'trap rich' SOI substrate and a 'trap rich double BOX' SOI substrate, respectively.

FIG. 8A relates to an SOI comprising a silicon substrate with high resistivity, as in FIG. 1A, whose reference signs are taken up by FIG. 8A. In this case, a back gate layer 4, made of an electrically conductive material and situated on the back face of the substrate 1 (i.e., on the side opposite the dielectric layer 2) is grounded, as are the two lateral conductive lines. The central conductive line, for its part, is set to the potential $V_{GB}$. As an alternative, the central conductive line could be grounded, and the other electrodes (lateral conductive lines and back gate layer) set to the potential $-V_{GB}$.

Figure 1B:
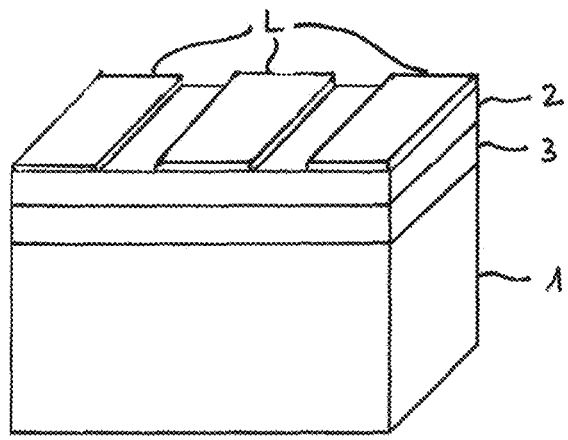
FIG. 1B is a perspective view of a radiofrequency circuit formed on an SOI substrate of 'trap rich' type.
Figure 8B:
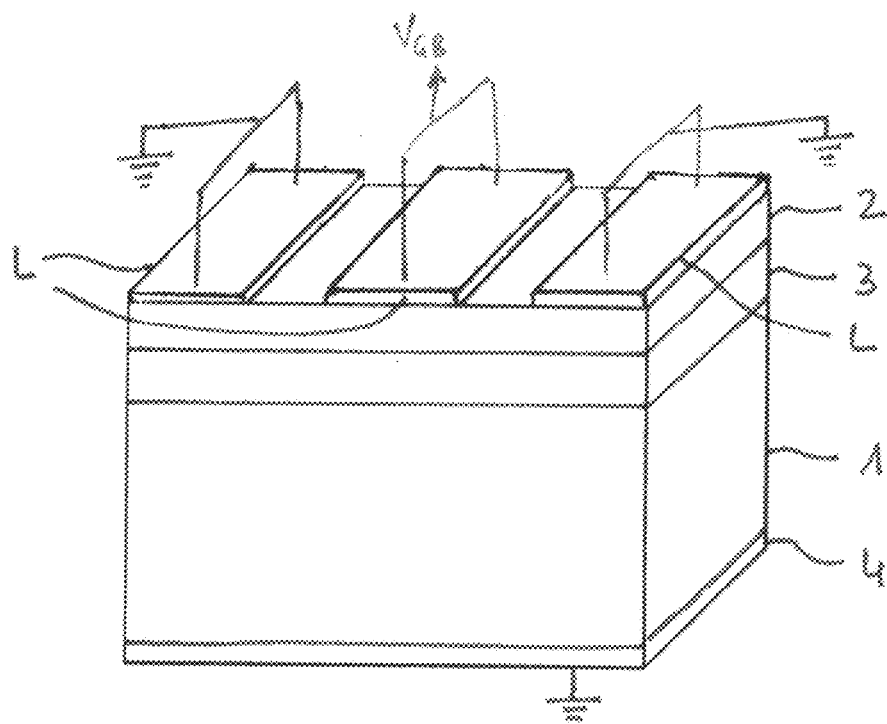

FIG. 8B relates to a 'trap rich' SOI comprising a polycrystalline silicon layer under the electrically insulating layer, as in FIG. 1B, whose reference signs are taken up by FIG. 8B. In this case, an electrically conductive back gate layer 4 situated on the back face of the substrate 1 (i.e., on the side opposite the dielectric layer 2 is grounded, as are the two lateral conductive lines. The central conductive line, for its part, is set to the potential $V_{GB}$. As an alternative, the central conductive line could be grounded, and the other electrodes (lateral conductive lines and back gate layer) set to the potential $-V_{GB}$.

Figure 1C:
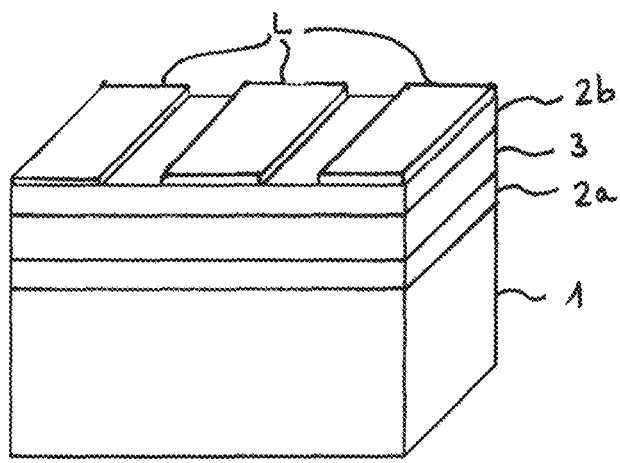
FIG. 1C is a perspective view of a radiofrequency circuit formed on a 'trap rich' SOI of 'double BOX' type.
Figure 8C:
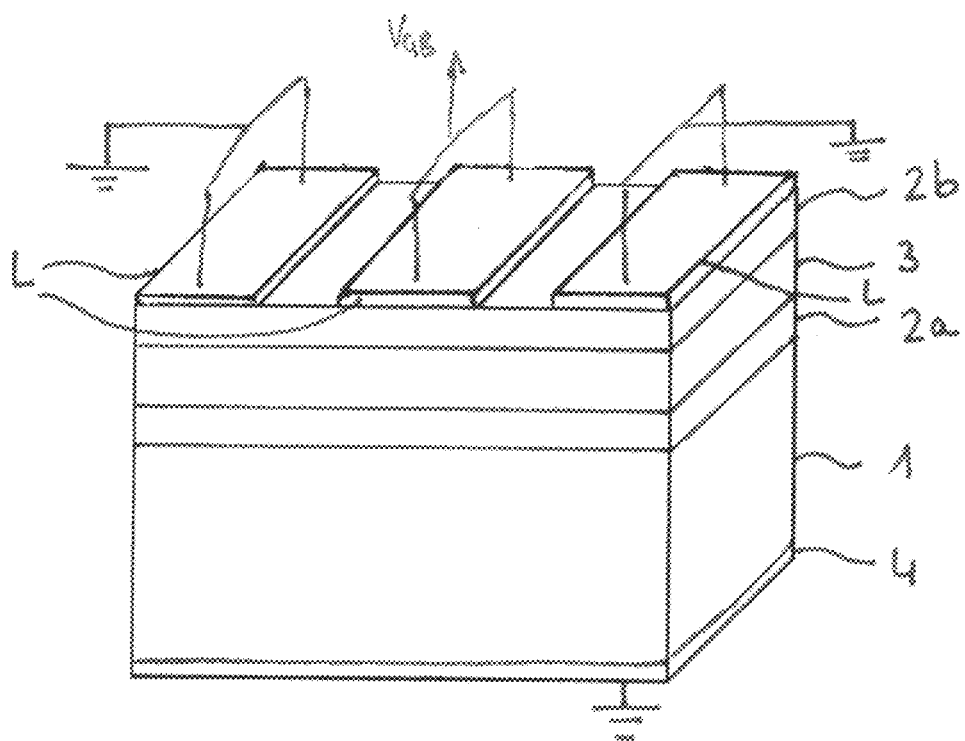

FIG. 8C relates to a 'trap rich double BOX' SOI comprising a polycrystalline silicon layer between two electrically insulating layers, as in FIG. 1C, whose reference signs are taken up by FIG. 8C. In this case, an electrically conductive back gate layer 4 situated on the back face of the substrate 1 (i.e., on the side opposite the dielectric layer 2b) is grounded, as are the two lateral conductive lines. The central conductive line, for its part, is set to the potential $V_{GB}$. As an alternative, the central conductive line could be grounded, and the other electrodes (lateral conductive lines and back gate layer) set to the potential $-V_{GB}$.

It will be noted that it is not essential to provide a back gate layer on the back face of the semiconductor substrate in order to make it possible to apply the potential difference $V_{GB}$. A reference potential may be set in the semiconductor substrate by any other means known to a person skilled in the art, such as a via extending from the front face through the electrically insulating layer as far as into the semiconductor substrate.

The invention claimed is:

1. A method for minimizing harmonic distortion and/or intermodulation distortion of a radiofrequency signal propagating in a radiofrequency circuit formed on a semiconductor substrate coated with an electrically insulating layer, wherein a curve representing the distortion as a function of a power of an input or output signal exhibits a trough around a given power ($P_{Dip}$), the method comprising applying, between the radiofrequency circuit and the semiconductor substrate, an electrical potential difference ($V_{GB}$) chosen so as to move the trough toward an operating power of the radiofrequency circuit.

2. The method of claim 1, wherein the electrical potential difference ($V_{GB}$) is chosen so as to comply with the following equation: $V_{pk}=|V_{GB}-V_{FB}|$, where $V_{pk}$ is the peak voltage of the radiofrequency signal and $V_{FB}$ is the flat band voltage.

3. The method of claim 1, wherein the semiconductor substrate has an electrical resistivity of greater than 500 Ω·cm.

4. The method of claim 3, wherein a polycrystalline silicon layer is disposed between the semiconductor substrate and the electrically insulating layer.

5. The method of claim 4, wherein an additional electrically insulating layer is disposed between the semiconductor substrate and the polycrystalline silicon layer.

6. The method of claim 1, wherein the semiconductor substrate comprises silicon.

7. The method of claim 1, further comprising adjusting the electrical potential difference ($V_{GB}$) applied between the semiconductor substrate and the radiofrequency circuit depending on the operating power of the radiofrequency circuit.

8. The method of claim 1, further comprising measuring a temperature of the radiofrequency circuit, and adjusting the electrical potential difference ($V_{GB}$) applied between the semiconductor substrate and the radiofrequency circuit depending on the measured temperature.

9. The method of claim 1, wherein the curve representing the distortion of the signal is a curve of the level of generation of a second or of a third harmonic of the input signal or of the output signal as a function of the power of the input signal or of a fundamental component of the output signal.

10. A radiofrequency device, comprising:
a radiofrequency circuit formed on a semiconductor substrate coated with an electrically insulating layer;
a contact connected electrically to the semiconductor substrate;
a device configured to apply a potential difference ($V_{GB}$) between the contact and the radiofrequency circuit, the potential difference ($V_{GB}$) selected so as to move a trough around a given power ($P_{Dip}$) in a curve representing harmonic distortion and/or intermodulation distortion of a radiofrequency signal propagating in the circuit as a function of a power of the input or output signal toward an operating power of the radiofrequency circuit.

11. The device of claim 10, wherein the device configured to apply the potential difference ($V_{GB}$) comprises a voltage generator and a voltage control module configured to adjust the voltage of the generator depending on the operating power of the radiofrequency circuit.

12. The device of claim 11, wherein the semiconductor substrate has an electrical resistivity of greater than 500 Ω·cm.

13. The device of claim 12, further comprising a polycrystalline silicon layer disposed between the semiconductor substrate and the electrically insulating layer.

14. The device of claim 13, further comprising an additional electrically insulating layer disposed between the semiconductor substrate and the polycrystalline silicon layer.

15. The device of claim 14, wherein the semiconductor substrate comprises silicon.

16. The device of claim 15, further comprising a temperature sensor coupled to the device configured to apply the potential difference ($V_{GB}$), the device configured to apply the potential difference ($V_{GB}$) being configured to adjust the potential difference depending on the temperature measured by the sensor.

17. The device of claim 15, further comprising a temperature sensor coupled to the device configured to apply the potential difference ($V_{GB}$), the device configured to apply the potential difference ($V_{GB}$) being configured to adjust the potential difference depending on the temperature measured by the sensor.

18. The device of claim 10, wherein the semiconductor substrate has an electrical resistivity of greater than 500 Ω·cm.

19. The device of claim 18, further comprising a polycrystalline silicon layer disposed between the semiconductor substrate and the electrically insulating layer.

20. The device of claim 10, wherein the semiconductor substrate comprises silicon.

* * * * *